United States Patent [19]

Koizumi et al.

[11] Patent Number: 4,476,436
[45] Date of Patent: Oct. 9, 1984

[54] POWER AMPLIFIER

[75] Inventors: Akio Koizumi, Funabashi; Hiroshi Yamagishi, Tokyo, both of Japan

[73] Assignee: Sony Corporation, Tokyo, Japan

[21] Appl. No.: 373,507

[22] PCT Filed: Aug. 25, 1981

[86] PCT No.: PCT/JP81/00188
§ 371 Date: Apr. 26, 1982
§ 102(e) Date: Apr. 26, 1982

[87] PCT Pub. No.: WO82/00739
PCT Pub. Date: Mar. 4, 1982

[30] Foreign Application Priority Data

Aug. 27, 1980 [JP] Japan .................. 55-118200

[51] Int. Cl.³ .................................. H03F 3/387
[52] U.S. Cl. ............................ 330/10; 330/251
[58] Field of Search ............ 330/9, 10, 207 A, 251; 332/9 R, 41

[56] References Cited

U.S. PATENT DOCUMENTS 4,293,817 10/1981 De Michele ............ 330/10 X
4,390,849 6/1983 Miskin ..................... 330/10 X Primary Examiner—James B. Mullins
Attorney, Agent, or Firm—Hill, Van Santen, Steadman & Simpson

[57] ABSTRACT

A power amplifier for use in a PWM signal includes a pulse width modulation signal generating circuit proportional to an amplitude of an input signal, an amplitude modulating circuit for amplitude-modulating the pulse width modulating signal in accordance with the level of the input signal and a power amplifying stage driven by the pulse width modulation signal which was amplitude-modulated. The amplitude modulating circuit or modulator is comprised of, by way of example, a pair of level shifting circuits (21) and (22), each being supplied with the input signal, a pair of switching circuits (23) and (24) for switching the respective outputs of these level shifting circuits by the pulse width modulation signal and an adder (25) for adding the outputs from these switching circuits, wherein this adder can produce at its output a pulse width modulation signal which is amplitude-modulated and the power amplifying stage utilizing bipolar transistors can efficiently be driven by this pulse width modulation signal.

9 Claims, 14 Drawing Figures

POWER AMPLIFIER

TECHNICAL FIELD

The present invention relates generally to a power amplifier and is directed more particularly to a power amplifier which is capable of amplifying a PWM (pulse width modulation) signal efficiently.

BACKGROUND ART

As a power amplifier for amplifying a PWM signal, known in the prior art is a so-called class D amplifier. Since such class D amplifier has a transistor at its output stage which can operate in a switching mode, the output transistor produces less heat and hence, it is generally used as a power amplifier which is small in construction but produces a large output. In general, since if a switching frequency is higher, the efficiency becomes higher and higher, for the switching transistor, is used a field effect transistor which can operate in high speed.

But, the field effect transistor for use in power amplification has a defect such that it becomes more expensive than a bipolar transistor.

On the other hand, since the bipolar transistor can not set its switching frequency as high because of its carrier concentration effect, it has also such drawback that is can not carry out the efficient power amplification.

DISCLOSURE OF INVENTION

Therefore, it is a main object of the present invention to provide a power amplifier which can obviate the aforesaid defects.

It is another object of the present invention to provide a power amplifier utilizing a bipolar transistor at its power amplifying stage to thereby perform an efficient amplification.

According to an example of the present invention, there is provided a power amplifier having a pulse width modulation signal generating circuit proportional to an amplitude of an input signal, an amplitude modulating circuit for amplitude-modulating the pulse width modulation signal in response to the level of the input signal and a power amplifying stage being driven by the pulse width modulation signal, the amplitude of which is modulated to perform power amplification efficiently.

BEST MODE FOR CARRYING OUT THE INVENTION

Figure 1:
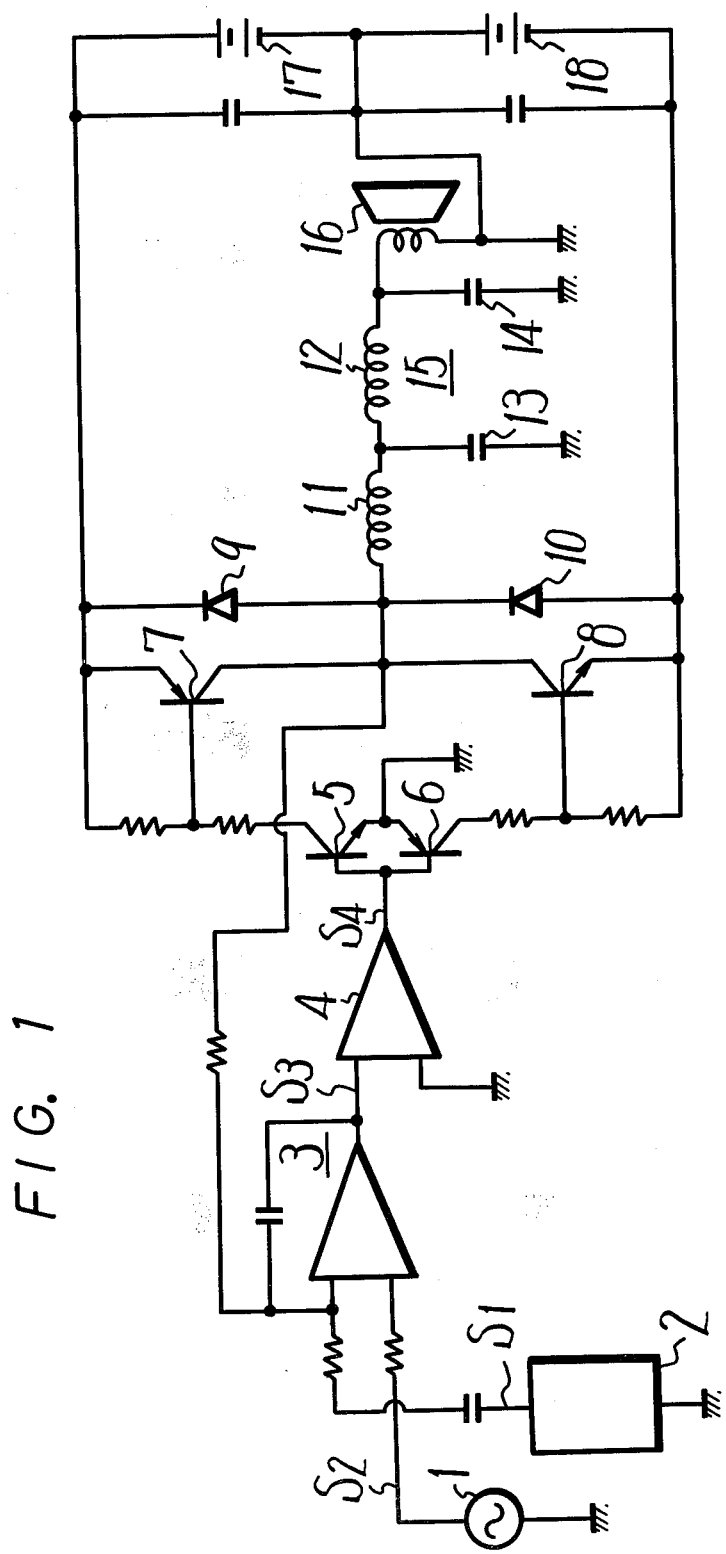
FIG. 1 is a circuit diagram schematically showing an example of a conventional power amplifier of a PWM type.
Figure 2:
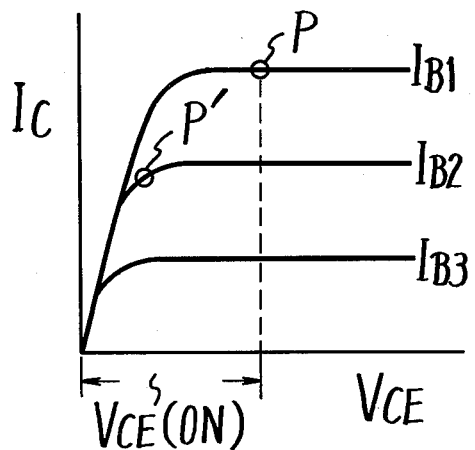
FIGS. 2, 3A–3C and 4 are characteristic graphs used to explain the operation of FIG. 1.
Figure 4:
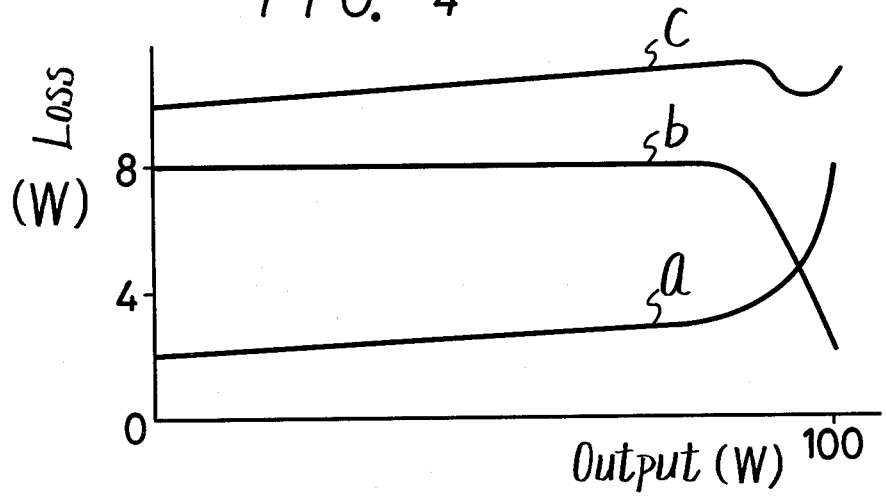
Figure 6A:
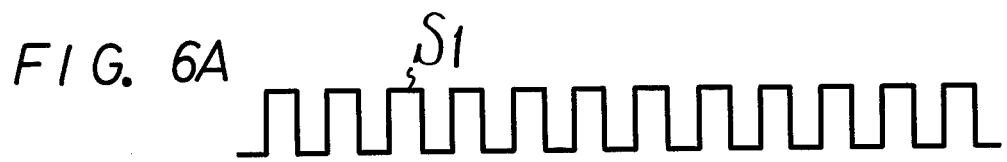
FIGS. 6A–6E are signal waveform diagrams used to explain the operations of FIGS. 1 and 5.
Figure 6B:
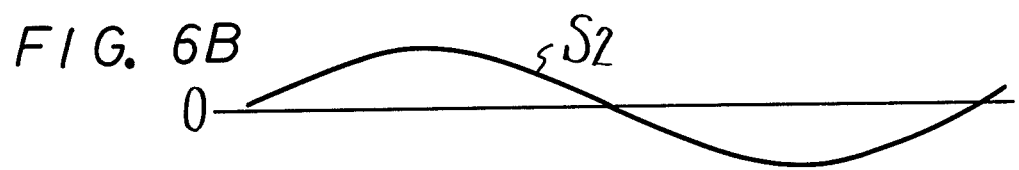
Figure 6C:
Figure 6D:
Figure 6E:
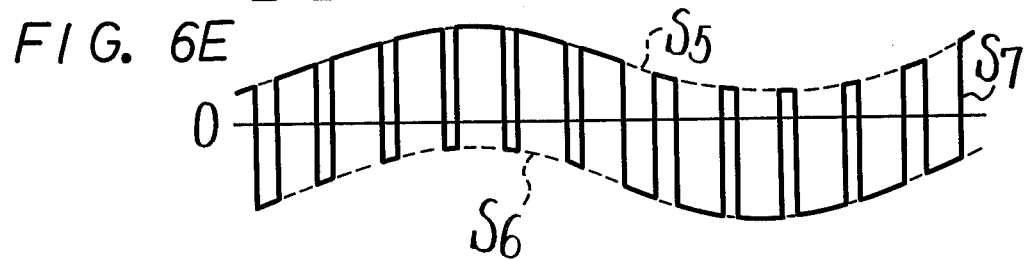

Prior to describing the present invention, as one of the conventional power amplifiers of such kinds, let us first describe an example which is provided at its final stage with a transistor of an emitter grounded saturation type as shown in FIG. 1. That is, in FIG. 1, reference numeral 1 generally denotes an input signal source for generating an input signal $S_2$, a waveform of which is nearly a sine wave as shown in FIG. 6B, 2 denotes a reference signal source for generating a clock signal $S_1$, a waveform of which is shown in FIG. 6A, 3 denotes an integrator for integrating the input signal $S_2$ on the basis of the clock signal $S_1$ so as to produce a saw-tooth wave signal $S_3$, a waveform of which is illustrated in FIG. 6C, and 4 denotes a comparator for comparing the saw-tooth wave signal $S_3$ with a reference level (zero level) so as to produce a PWM signal $S_4$ shown in FIG. 6D.

Further, 5 to 8 designate transistors forming a voltage amplifying section in which diodes 9 and 10 for use in absorbing charges are respectively connected in parallel to emitter-collector paths of the transistors 7 and 8 at the final stage. If each of these transistors is made of a non-saturation type transistor, these diodes are each connected to base-collector paths of the transistors. Then, the output signals of the transistors 7 and 8 are delivered through a filter 15, which is comprised of coils 11 and 12 and capacitors 13 and 14, to a speaker 16 to be sounded. 17 and 18 denote DC voltage supply sources.

Figure 3A:
Figure 3B:
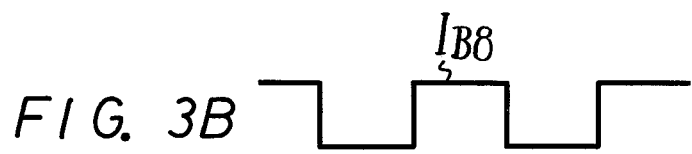
Figure 3C:
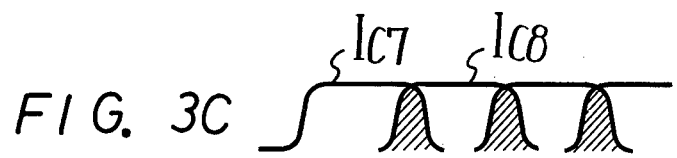

By the way, in the case of the power amplifier in which the transistors at the final stage are each constructed as the emitter grounded saturation type, $V_{CE(ON)}$ is low and hence high efficiency can be expected. Nevertheless, since an operation point P at that time exists in the saturated region as illustrated in FIG. 2, even if the current which will be supplied to the bases of the transistors 7 and 8 is lost, the charges still remain in the transistors 7 and 8. As a result, the collector currents are not made OFF immediately and the current flows from the emitter-collector path of the transistor 7 to the collector-emitter path of the transistor 8, which causes the power amplifying efficiency to be deteriorated. FIGS. 3A to 3C show such state, in which when the transistors 7 and 8 are supplied with some base currents $I_{B7}$ and $I_{B8}$ as shown in FIGS. 3A and 3B, respectively, collector currents $I_{C7}$ and $I_{C8}$ flow respectively as shown in FIG. 3C. Generally, when the base currents $I_{B7}$ and $I_{B8}$ do not flow, it should be supposed that the collector currents $I_{C7}$ and $I_{C8}$ would not flow nearly simultaneously. But, when the charges remain as described above, for this reason as illustrated by hatchings in FIG. 3C, some parts or sections in which the collector currents $I_{C7}$ and $I_{C8}$ flow in a manner that they are superimposed to each other are produced, and these currents flow from the transistor 7 to the transistor 8, which is why the power amplifying efficiency is deteriorated.

This is mainly because when an optimum bias is set in the prior art, in order to widen an effective dynamic range, the base current is designed in consideration of the collector current $I_C(max)$ upon large output, so that in case of the medium output there are too much base currents and hence it takes a long time to absorb the charges accumulated therein. More precisely, for example, as shown in FIG. 2, in the prior art, although the operation point in case of the medium output stays at the position denoted by P' which is immediately before the entrance of the saturated region, in case of the large output, the operation point stays at the position denoted by which enters deeply or completely into the saturated region. In this case, since the base current $I_{B1}$ at the operation point P is selected as the optimum bias setting and then held fixed so as to actuate the power amplifier, in case of the medium output, instead of original base current $I_{B2}$ being sufficient, base currents corresponding to the difference between the base currents $I_{B1}$ and $I_{B2}$ are flowed excessively, so that it takes much time to absorb the accumulated charges for the aforesaid excessive amounts.

FIG. 4 is a graph showing output-loss characteristic of the conventional power amplifier and of which operations are arranged as described above. In FIG. 4, a curve a is the characteristic which expresses a loss caused by $V_{CE(ON)}$, a curve b a characteristic showing a loss caused by the switching speed and a curve c a characteristic showing a summation of the above both losses.

As described above, in case of the conventional power amplifier, since the base current is fixed and the position of the $V_{CE(ON)}$ exists within the saturated region, it takes much time to absorb the accumulated charges and then, as described in association with the representations of FIG. 3, the current flows from the transistor 7 to the transistor 8, so that the efficiency is deteriorated and as will be understood from FIG. 4, the loss at that time becomes extremely large.

In view of the above aspects, the present invention is proposed and to provide a power amplifier which has less loss and which is extremely high in efficiency.

One embodiment of a power amplifier according to the present invention will hereinafter be described in detail with reference to FIGS. 5 to 8.

Figure 5:
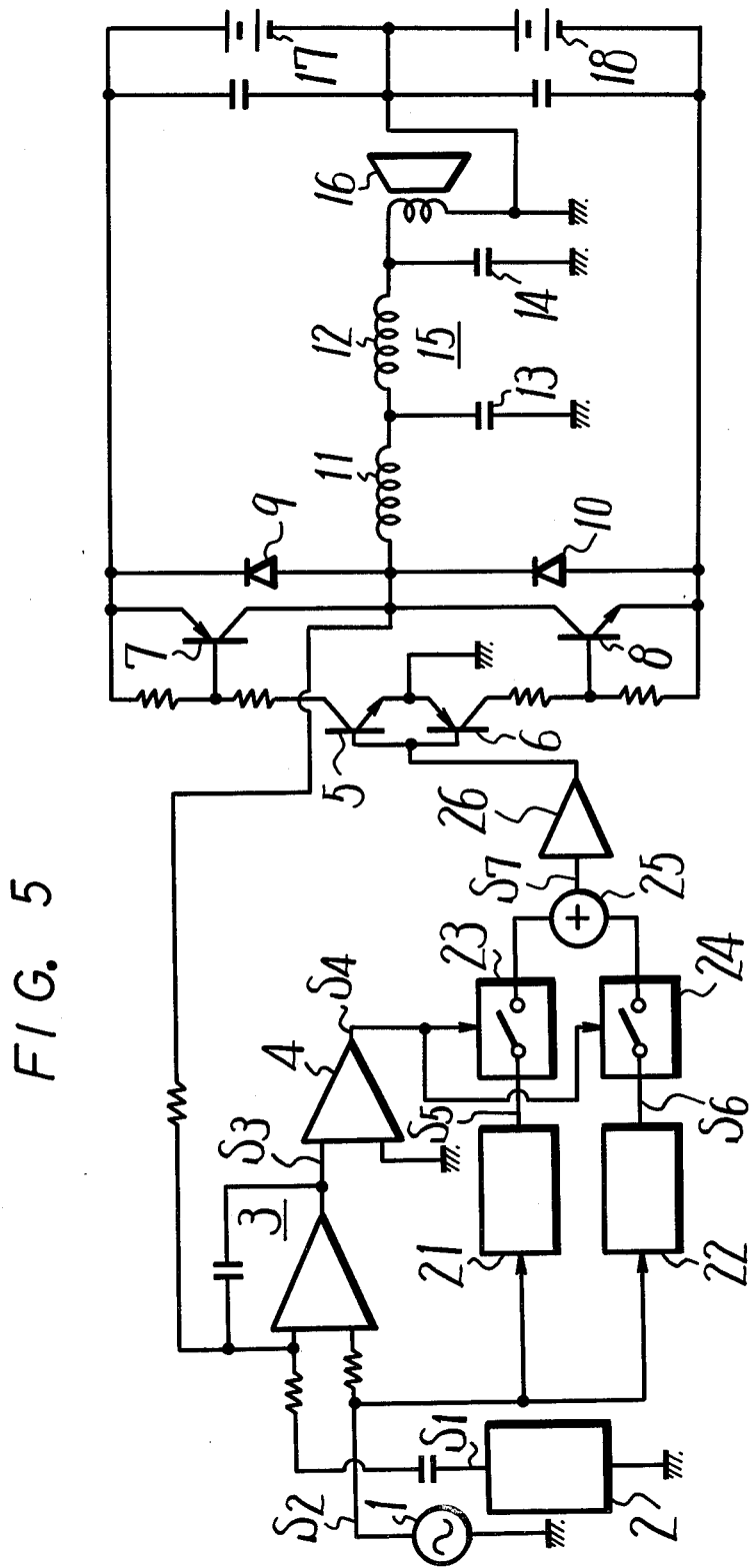
FIG. 5 is a circuit diagram for showing an embodiment of the present invention.

FIG. 5 schematically shows a circuit arrangement of the present embodiment. In FIG. 5, like references corresponding to those of FIG. 1 designate the same elements and parts and hence their detailed explanation will be omitted. In this embodiment, there are provided a positive level shifting circuit 21 and a negative level shifting circuit 22, each serving for level-shifting the input signal $S_2$, which is supplied from the input signal source 1, to positive and negative sides. At the output sides thereof are produced signals $S_5$ and $S_6$, which are respectively shown by broken lines in FIG. 6E. The signals $S_5$ and $S_6$ thus derived are supplied through switching circuits 23 and 24 whose open and close operations are controlled by a PWM signal $S_4$ delivered from a comparator 4, to an adder 25 which produces at its output side a signal $S_7$ shown by a solid line in FIG. 6E. In other words, at the output side of the adder 25 is produced the PWM signal $S_4$ which is amplitude-modulated by the signals $S_5$ and $S_6$, each being level-shifted to the positive and negative sides.

The PWM signal $S_7$ thus amplitude-modulated is supplied through a buffer circuit 26 to the bases of the transistors 5 and 6 selectively. Other arrangements are the same as those of FIG. 1.

The circuit operation of the embodiment will be described next. When the input signal source 1 produces the input signal $S_2$ as shown in FIG. 6B, this input signal $S_2$ is integrated by an integrator 3 on the basis of the clock signal $S_1$ which is, supplied from the reference signal source 2 and shown in FIG. 6A, and then converted to the saw-tooth wave signal $S_3$ shown in FIG. 6C. This saw-tooth wave signal $S_3$ is delivered to the comparator 4 in which it is compared with the reference level. Thus, the comparator 4 produces at its output side the PWM signal $S_4$ shown in FIG. 6D.

On the other hand, the input signal $S_2$ from the input signal source 1 is also supplied to the level shifting circuits 21 and 22 in which it is level-shifted respectively to the positive and negative sides. Accordingly, the level shifting circuits 21 and 22 produce at the output sides thereof the signals $S_5$ and $S_6$ respectively shown by the broken lines in FIG. 6E, which are then supplied to the corresponding switching circuits 23 and 24. The switching circuits 23 and 24 are controlled in their open and closed states by the PWM signal $S_4$ obtained at the output side of the comparator 4, so that they produce selectively the signal $S_5$ or $S_6$ applied thereto. More specifically, when the PWM signal $S_4$ is positive, the switching circuit 23 is closed to produce the signal $S_5$ shifted in level to the positive side, while when the PWM signal $S_4$ is negative, the switching circuit 24 is closed to produce the signal $S_6$ shifted in level to the negative side. The delivered signals are supplied in turn to the adder 25, by which the adder 25 produces at its output side the signal $S_7$ shown by the full line in FIG. 6E, that is, the PWM signal $S_7$ thus amplitude-modulated.

The PWM signal $S_7$ controls the transistors 5 and 6, by which the corresponding base currents are supplied to the transistors 7 and 8 at the final stage. The base current $I_B$ for which the transistors 7 and 8 operate in saturated state is set as in the following equation if the collector current and the current amplification factor of the transistors 7 and 8 are respectively taken as $I_C$ and $h_{FE}$.

$$I_B \simeq (1.5 \sim 3) \frac{I_C}{h_{FE}} \tag{1}$$

That is, the base current of the transistors 7 and 8 is varied by the signal $S_7$, which is provided by amplitude-modulating the PWM signal $S_4$ with the input signal $S_2$, to always satisfy the above equation (1).

Figure 7:
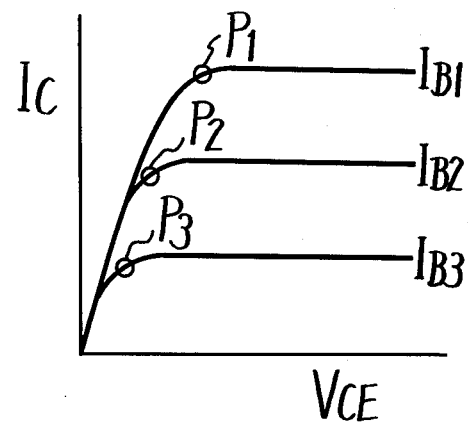
FIGS. 7 and 8 are characteristic graphs used to explain the operation of FIG. 5.

At this time, the operation points $P_1$ to $P_3$ of the transistors 7 and 8 move always immediately before the entrance of the saturation region in accordance with the increase or decrease of the collector current $I_C$ as shown in FIG. 7. In other words, since only the required minimum base currents in response to the respective outputs are supplied to the transistors 7 and 8 and when the supply of the base currents are ceased, the collector current no longer flows therethrough, such phenomenon is avoided as in case of FIG. 1, that the charges are accumulated in the transistors 7 and 8 and even though the base current is lost, the collector current is not made OFF at once and the current corresponding to the sections shown by hatchings in FIG. 3C will substantially flow from the emitter-collector path of the transistor 7 to the collector-emitter path of the transistor 8.

Figure 8:
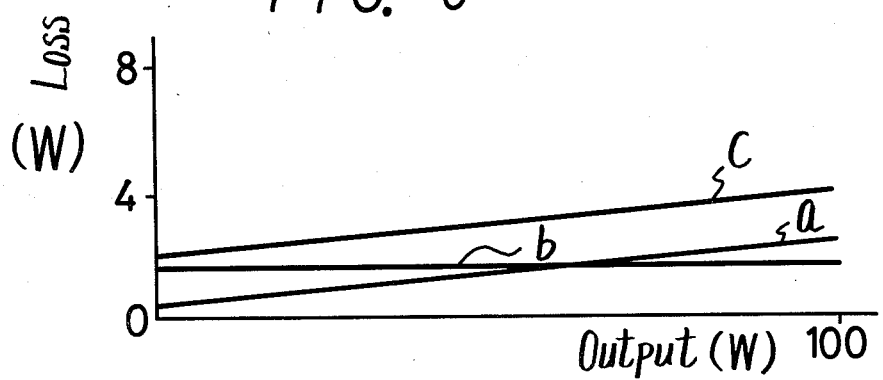

FIG. 8 is a graph showing an output-loss characteristic in the embodiment of the present invention. In FIG. 8, a curve a represents a characteristic to express a loss caused by the $V_{CE(ON)}$, a curve b represents a characteristic to express a loss caused by a switching speed and a curve c represents a characteristic to express a summation characteristic of both of the above losses. Comparing the loss characteristics of FIG. 8 with those of the conventional circuit shown in FIG. 4, it is apparent that the output-loss characteristic of the power amplifier according to the present invention is largely improved. In addition, as will be understood from FIG. 8, in the circuitry of the present invention, since the output-loss characteristics change substantially linear, the distortion factor is improved over the whole range of the output.

As described above, according to the present invention, since the PWM signal which will be supplied to the bases of the transistors at the output stage is further amplitude-modulated by the input signal and the base currents are varied in a predetermined range so as to control the transistors in such a way that the operation points of the transistors at the output stage may always stay immediately before the entrance of the saturation region thereof, it is possible to provide such power amplifier which has less losses caused by the $V_{CE(ON)}$, the switching speed and so on and which is low in distortion factor and high in efficiency.

We claim:

1. A power amplifier having means for generating a pulse width modulation signal proportional to the amplitude of an input signal comprising, in combination;
   a pair of level shifting means, means supplying said input signal to each of said level shifting means, a pair of switching means connected individually to said level shifting means for switching output signals from said pair of level shifting means in response to said pulse width modulation signal,
   adding means connected to said switching means for adding output signals from said switching means, wherein the pulse width modulation signal is amplitude-modulated in accordance with the level of the input signal,
   and a power amplifying stage connected to receive the output of said adding means.

2. A power amplifier according to claim 1, wherein said pair of level shifting means is operative to shift the level of said input signal by a predetermined amount in positive and negative directions, respectively.

3. A power amplifier according to claim 1, wherein said pulse width modulating means comprises an integrating means for integrating output signals from an input signal source, and a comparing means for comparing the output signal from said integrating means with a reference voltage, wherein said pulse width modulation signal is produced at an output terminal of said comparing means.

4. A power amplifier according to claim 1, wherein said power amplifying stage comprises a pair of bipolar transistors connected in a complimentary push-pull circuit.

5. A power amplifier according to claim 4, wherein said pair of transistors are respectively connected in a common emitter circuit.

6. The power amplifier according to claim 4, wherein said modulating means is connected to said pair of bipolar transistors for biasing the operating points of said bipolar transistors.

7. The power amplifier according to claim 6, wherein said level shifting means functions to supply said bipolar transistors with a minimum base current which does not greatly saturate said transistors at any input signal level.

8. The power amplifier according to claim 6, wherein said modulating means controls the base current supplied to said bipolar transistors such that the base current is approximately one and a half to three times the quotient of $I_c/h_{FE}$.

9. Apparatus according to claim 1, wherein said power amplifing stage comprises a voltage amplifier.

* * * * *